United States Patent
Perner et al.

(10) Patent No.: US 6,879,534 B2
(45) Date of Patent: Apr. 12, 2005

(54) METHOD AND SYSTEM FOR MINIMIZING DIFFERENTIAL AMPLIFIER POWER SUPPLY SENSITIVITY

(75) Inventors: Frederick Perner, Palo Alto, CA (US); Kenneth Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 7 days.

(21) Appl. No.: 10/286,577

(22) Filed: Nov. 1, 2002

(65) Prior Publication Data

US 2004/0085122 A1 May 6, 2004

(51) Int. Cl.[7] ............. G11C 7/02; G11C 7/00; H02M 11/00; G06G 7/18
(52) U.S. Cl. ............ 365/209; 365/196; 365/189.09; 327/343; 327/103
(58) Field of Search ................ 365/209, 196, 365/189.09, 207, 189.07; 327/343, 103

(56) References Cited

U.S. PATENT DOCUMENTS

| | | | | |
|---|---|---|---|---|
| 5,343,086 A | * | 8/1994 | Fung et al. ............ 327/63 |
| 5,544,110 A | * | 8/1996 | Yuh ............... 365/205 |
| 5,677,634 A | * | 10/1997 | Cooke et al. ............ 324/548 |
| 5,801,556 A | * | 9/1998 | LeFevre ............ 327/103 |
| 5,828,329 A | * | 10/1998 | Burns ............... 341/155 |
| 5,838,145 A | * | 11/1998 | Poon et al. ............ 323/266 |
| 5,969,998 A | * | 10/1999 | Oowaki et al. ........ 365/189.09 |
| 5,999,050 A | * | 12/1999 | Baltus ............... 330/252 |
| 6,064,188 A | * | 5/2000 | Takashima et al. ...... 323/316 |
| 6,128,239 A |   | 10/2000 | Perner |
| 6,215,291 B1 | * | 4/2001 | Mercer ............... 323/313 |
| 6,232,832 B1 | * | 5/2001 | Kirkpatrick, II ........ 327/560 |
| 6,351,182 B1 | * | 2/2002 | Drapkin et al. ........ 327/543 |
| 6,434,707 B1 | * | 8/2002 | Eklof ............... 713/500 |
| 6,513,383 B1 | * | 2/2003 | Okano et al. ........... 73/514.34 |
| 6,587,002 B1 | * | 7/2003 | Vogt ............... 330/298 |
| 6,700,416 B1 | * | 3/2004 | Cowles ............... 327/74 |
| 6,710,618 B1 | * | 3/2004 | Murray ............... 326/30 |
| 2002/0034112 A1 | * | 3/2002 | Kato et al. ............ 365/201 |
| 2002/0063575 A1 | * | 5/2002 | Kim et al. ............ 326/30 |
| 2002/0145412 A1 | * | 10/2002 | Kato ............... 323/316 |
| 2003/0048653 A1 | * | 3/2003 | Watanabe et al. ........ 363/127 |

FOREIGN PATENT DOCUMENTS

JP          2004192743 A    *   7/2004    ............. G05F/1/10

* cited by examiner

*Primary Examiner*—David Nelms
*Assistant Examiner*—Ly Duy Pham
(74) *Attorney, Agent, or Firm*—Brian R Short (57) ABSTRACT

The invention includes an apparatus and a method for minimizing power supply sensitivity of a differential amplifier. The apparatus includes a current source providing a differential amplifier bias current to a common source node of the differential amplifier. A voltage sensor senses variations of a power supply associated with the current source. Variations sensed by the voltage sensor control a magnitude of the differential amplifier bias current. The method includes a current source providing the source current. A voltage potential of the common source node is sensed. The current source is adjusted depending upon the sensed voltage potential of the common source node, thereby adjusting a magnitude of the source current.

12 Claims, 13 Drawing Sheets

METHOD AND SYSTEM FOR MINIMIZING DIFFERENTIAL AMPLIFIER POWER SUPPLY SENSITIVITY

FIELD OF THE INVENTION

The invention relates generally to electronic amplifiers. More particularly, the invention relates to a method and apparatus for minimizing differential amplifier power supply sensitivity.

BACKGROUND OF THE INVENTION

Computing devices require memory. The memory can include read only memory (ROM) or random access memory (RAM). Generally, memory includes memory cells that are arranged in rows and columns. The individual memory cells are accessed through the use of row select lines and column select lines, typically referred to as word lines and bit lines.

Figure 1:
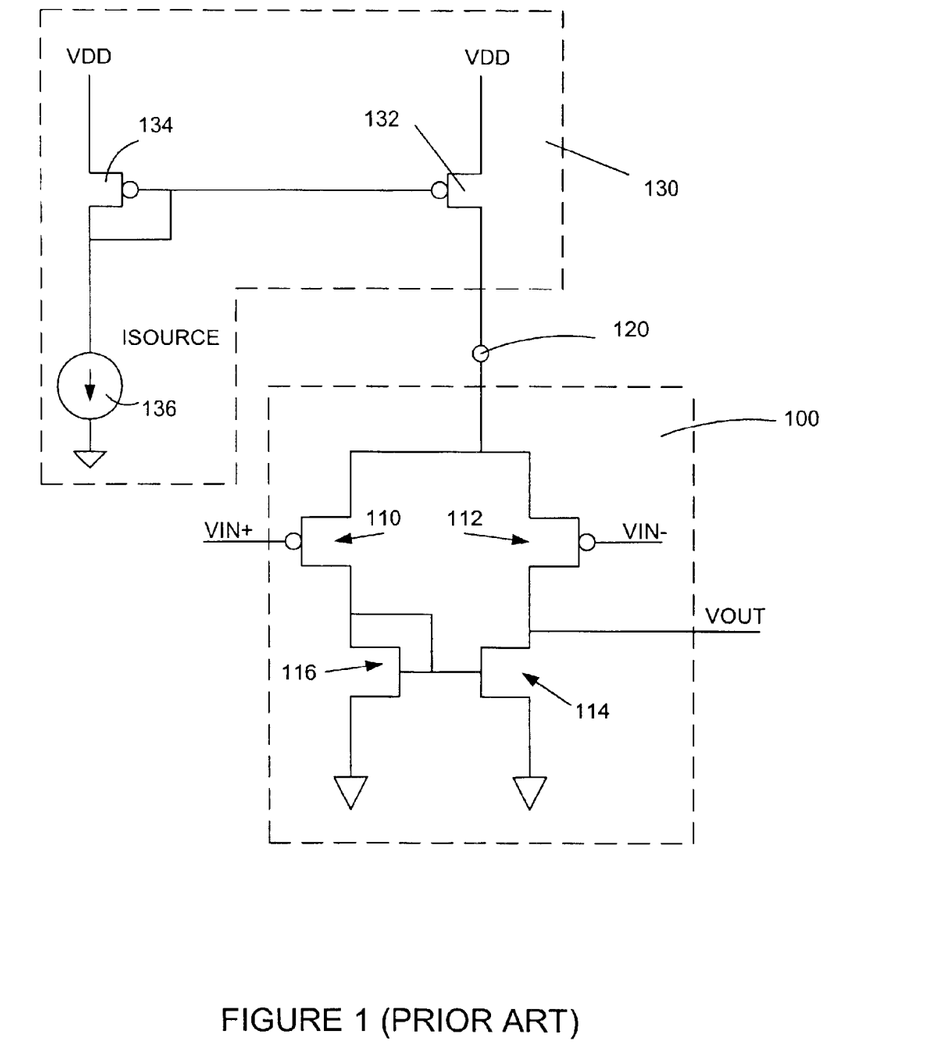
FIG. 1 shows a prior art differential amplifier and an associated current source supply.

Typically, sense amplifiers are connected to the bit lines for sensing a state of memory cells connected to the bit lines. The sense amplifiers generally each include a differential amplifier. FIG. 1 shows a differential amplifier 100 and an associated current source 130.

The typical differential amplifier of FIG. 1 includes four transistors 110, 112, 114, 116. Input transistors 110, 112 receive differential voltage inputs (VIN+, VIN−). An output (VOUT) is generated across an output transistor 114. The differential amplifier conducts current through a common source node 120.

Generally, the current source 130 is connected to the common source node 120 to provide the differential amplifier with a proper bias current. The current source 130 can include a current mirror. A first transistor 132 mirrors current flowing through a second transistor 134. A current source 136 determines the current flowing through the second transistor 134, and therefore, the current flowing through the first transistor 132, and therefore, the current flowing through the common source node 120. As a result, the current source 136 (ISOURCE) sets the bias current of the differential amplifier 100.

The current source 130 and the differential amplifier implementation shown in FIG. 1 include P-channel transistors. An analogous N-channel current source and differential amplifier implementation is also possible.

A liability of the current source 130, differential amplifier combination of FIG. 1, is that variations of the power supply VDD tend to cause variations of a voltage potential of the common source node 120. The bias current provided by the current source 130 can vary as the power supply voltage VDD varies. The current variance of the current source 130 causes the voltage potential of the common source node 120 to vary. Variations of the voltage potential of the common source node 120 tend to cause voltage variations of the output (VOUT). The net result is that the output (VOUT) is sensitive to variations of the power supply voltage VDD.

The previously mentioned MRAM sense amplifiers require a minimization of power supply sensitivity. MRAM circuitry selects and isolates individual MRAM memory cells within large two-dimensional arrays of MRAM cells. An embodiment of an MRAM sense amplifier is similar to the differential amplifier of FIG. 1, and interfaces with the MRAM selection circuitry. The MRAM sense amplifier relies on sensitivity and power supply rejection. Small voltage variations of the common source node 120 can cause errors or system correction actions that affect the performance of the sense operations of the MRAM circuits. Minimizing the power supply sensitivity improves the reliability and performance of the MRAM sense circuits.

It should be noted that other types of RAM (for example, SRAM and DRAM) do not require the power supply sensitivity required by MRAM because other types of memory generally operate with much larger sense signals.

It is desirable to have a method and apparatus for minimizing power supply sensitivity of differential amplifiers. It is desirable that the method and apparatus be adaptable for use with MRAM sense amplifiers.

SUMMARY OF THE INVENTION

The invention includes an apparatus and method for minimizing power supply sensitivity of differential amplifiers. The method and apparatus are adaptable for use with MRAM sense amplifiers.

An embodiment of the invention includes an apparatus for minimizing power supply sensitivity of a differential amplifier. The apparatus includes a current source providing a differential amplifier bias current to a common source node of the differential amplifier. A voltage sensor senses variations of a power supply associated with the current source, and the differential amplifier. Variations sensed by the voltage sensor control a magnitude of the differential amplifier bias current.

Another embodiment of the invention includes a method for minimizing power supply sensitivity of a differential amplifier. The differential amplifier conducts a source current at a common source node. The method includes a current source providing the source current. A voltage potential of the common source node is sensed. The current source is adjusted depending upon the sensed voltage potential of the common source node, thereby adjusting a magnitude of the source current.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in a method and apparatus for reducing supply voltage sensitivity of a differential amplifier.

Figure 2:
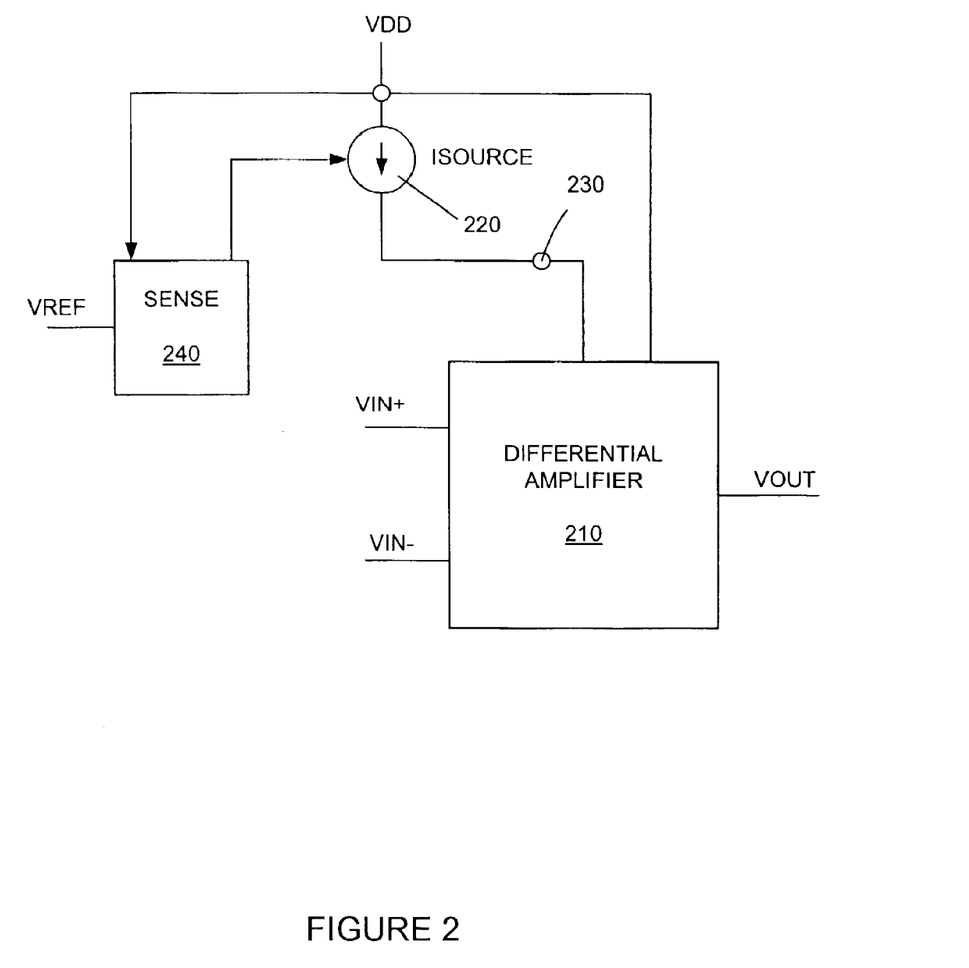
FIG. 2 shows a differential amplifier and corresponding current source according to an embodiment of the invention.

FIG. 2 shows a differential amplifier 210 and corresponding current source 220 according to an embodiment of the invention. The current source 220 of this embodiment provides a differential amplifier bias current (ISOURCE) to a common source node 230 of the differential amplifier 210. A voltage sensor 240 senses variations of a voltage potential of a power supply (VDD) associated with the current source 220. Voltage potential variations sensed by the voltage sensor 240 control a magnitude of the differential amplifier bias current. The current source 220 is adjustable. That is, the current flowing to or from the current source 220 can be adjustably varied.

As previously described, voltage potential variations of the power supply voltage (VDD) generally causes a corresponding voltage potential variation of the common source node 230. The voltage potential variation of the common source node 230 subsequently causes a voltage variation to be coupled to the output (VOUT) of the differential amplifier 210. Voltage potential variations of the common source node 230 can be contradicted by the current source 220.

Generally, the differential amplifier 210 includes at least a pair of transistors. The transistors are typically connected to the common source node 230, and conduct current from the common source node 230. Current is provided to the common source node 230 by the current source 220. The current source 220 can include a current mirror that mirrors a current mirror bias current. The current mirror bias current can be adjustable.

The voltage sensor 240 includes a reference voltage VREF. The voltage sensor compares a received voltage potential (here, the received voltage potential is VDD) with the reference voltage VREF, and generates an output control that is proportional to the voltage potential difference. Therefore, variations of the received voltage potential influence the output control. Voltage sensors are well know in the art of electronics.

The following described embodiments of the invention include the received voltage potential being the power supply voltage VDD. It is to be understood that any voltage potential that proportionally represents the power supply voltage VDD can be substituted as the received voltage potential.

An adjustable current source, like the adjustable current source 220, is well know in the art of electronics.

Generally, power supply (VDD) sensitivity of the differential amplifier 210 is dependent upon the power supply sensitivity of the current source 220 connected to the differential amplifier 210. Variations of the current source 220 due to the power supply VDD cause voltage potential variations of the common source node 230 of the differential amplifier 210, which in turn, cause voltage potential variations in the output (VOUT) of the differential amplifier 210.

The relationships between the power supply VDD, the current source 220 and variations in the differential amplifier output (VOUT) can modeled by the following equation:

delta $Vs = KV*$(delta $VDD$)$+KI*$(delta $I$), where delta Vs represents the variations in the differential amplifier output voltage, KV is a multiplier relationship between the power supply voltage VDD and the differential amplifier output voltage (VOUT), delta VDD represents variations in the power supply voltage VDD, KI is a multiplier relationship between the current source 220 and the differential amplifier output voltage (VOUT), and delta I represents variations in the current source 220.

The invention includes controlling KI to minimize delta Vs. For example, if KI can be controlled to be:

$KI = -KV$((delta $VDD$)/(delta $I$)), then delta Vs in the above equation is forced to zero, thereby minimizing the sensitivity of the differential amplifier output to variations of the power supply. The invention includes several different methods for controlling KI.

Figure 3:
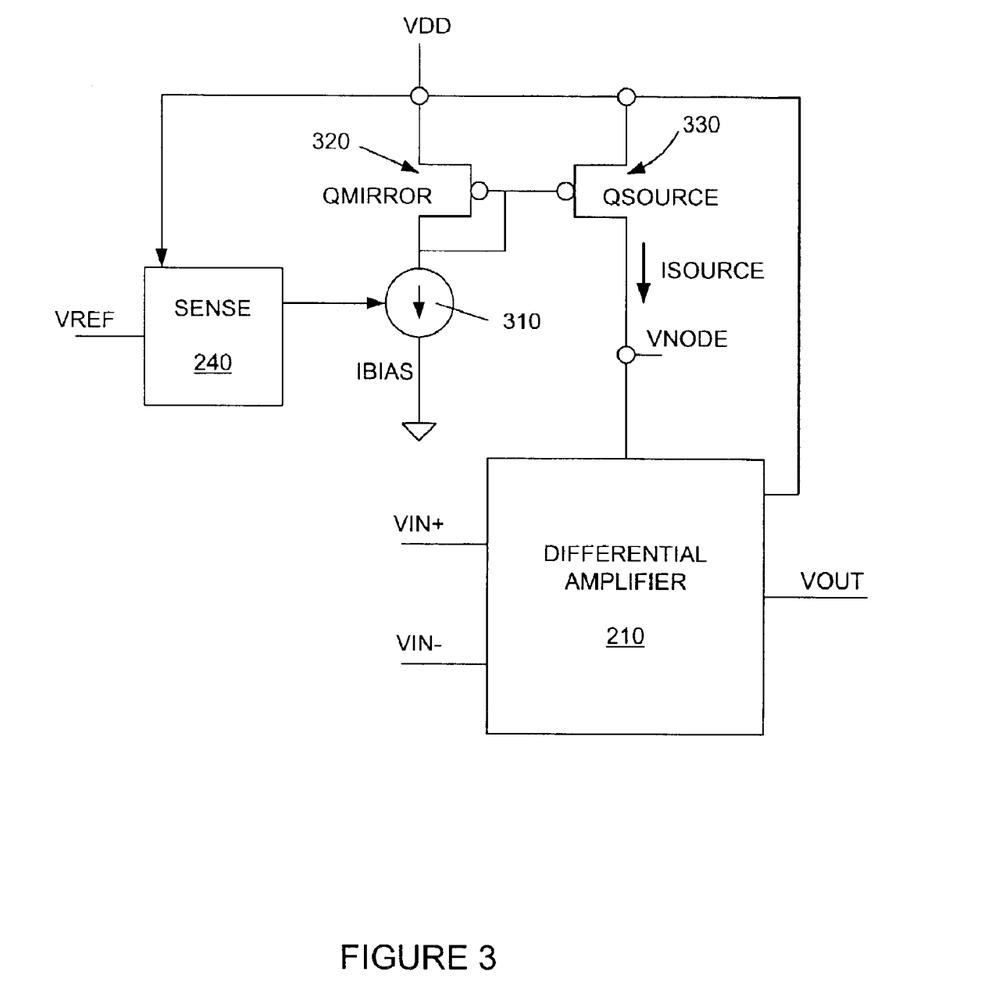
FIG. 3 shows a differential amplifier and corresponding current source according to another embodiment of the invention.

FIG. 3 shows a differential amplifier 210 and corresponding current source according to another embodiment of the invention. The current source of this embodiment includes a current mirror. The current mirror includes an amplifier bias current transistor 330 and a mirror transistor 320.

Current flowing through the mirror transistor 320 is determined by a current source 310. As previously described, the voltage sensor 240 generates a control output that is dependent upon variations of the power supply voltage VDD.

Variations of the power supply voltage cause the output of the voltage sensor 240 to adaptively vary the bias current (IBIAS) of the current source 310. The current flowing through the mirror transistor 320 is proportionally varied. Therefore, the current flowing through the amplifier bias current transistor 330 also proportionally varies, which proportionally varies the current (ISOURCE) flowing through the common source node (VNODE) of the differential amplifier 210.

The inclusion of the current mirror providing current to the common source node (VNODE) rather than the current source providing current directly to the common source node provides an advantage that current can be provided to many common source nodes simultaneously. That is, many amplifier bias current transistors 330 can simultaneously source current to a corresponding common source node of many different differential amplifiers. Additionally, the current mirror and current source combination of FIG. 3 is easy to control, and provides a wide dynamic range for the bias control.

Figure 4A:
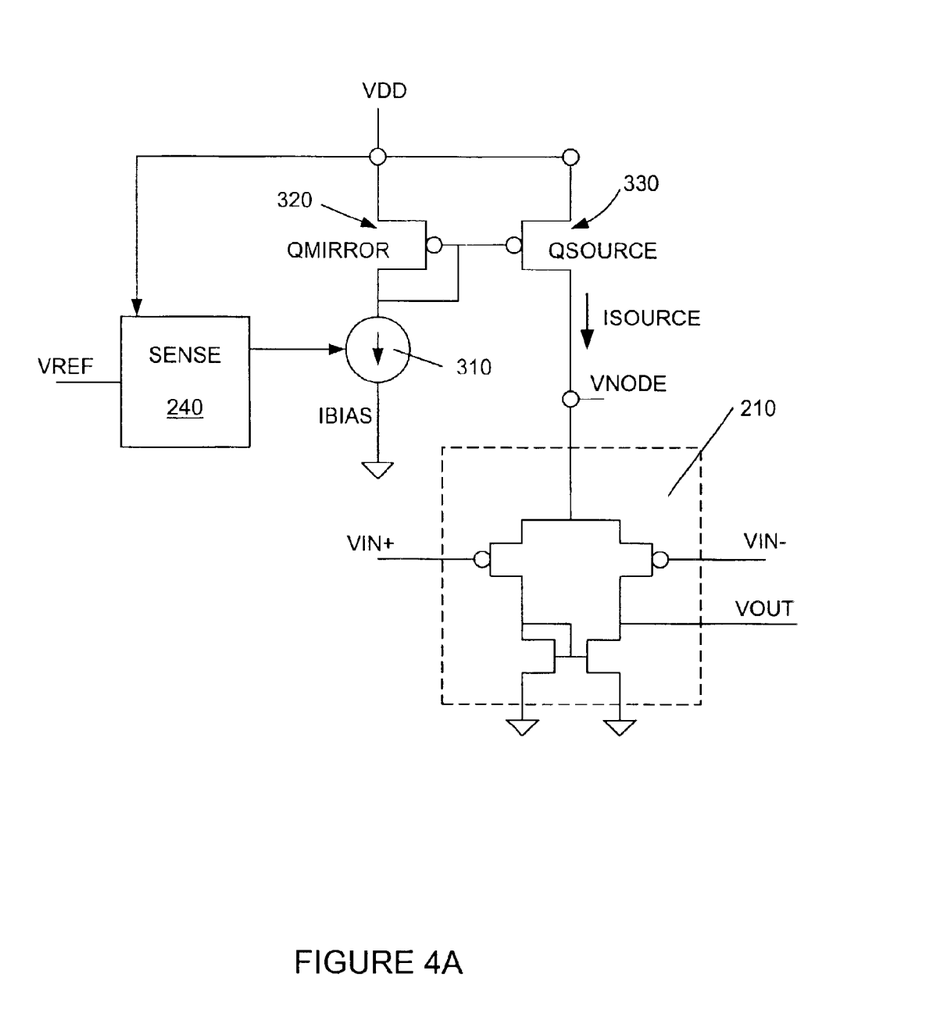
FIG. 4A shows a P-channel differential amplifier and a corresponding P-channel current source according to another embodiment of the invention.

FIG. 4A shows a P-channel differential amplifier and a corresponding P-channel current source according to another embodiment of the invention. This embodiment is similar to the embodiment of FIG. 3, but includes details of an embodiment of the differential amplifier 210.

Figure 4B:
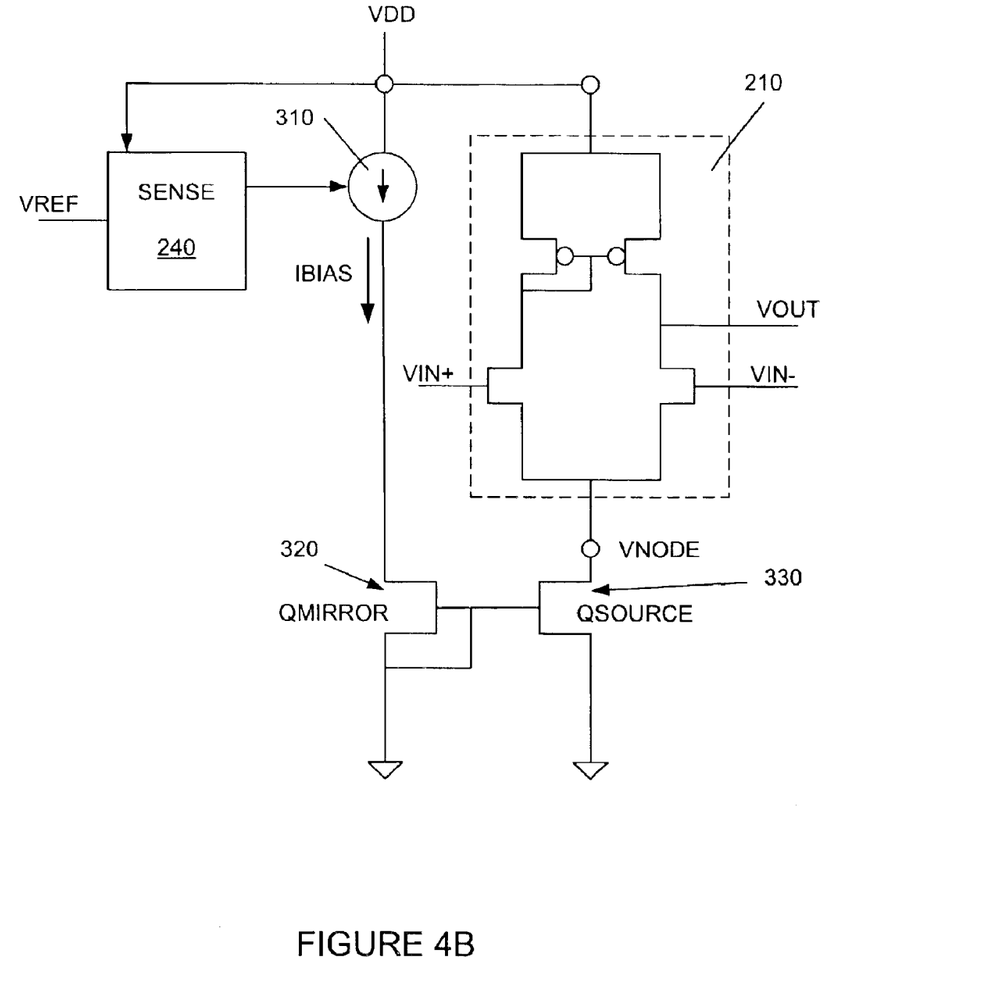
FIG. 4B shows an N-channel differential amplifier and a corresponding N-channel current source according to another embodiment of the invention.

FIG. 4B shows an N-channel differential amplifier and a corresponding N-channel current source according to another embodiment of the invention. This embodiment is similar to the embodiment of FIG. 3, but includes details of an embodiment of the differential amplifier 210, and depicts an N-channel implementation of the current source.

The embodiments of FIG. 4A and FIG. 4B have been included to show that all of the embodiments of the invention can be implemented with either P-channel or N-channel transistors. The following embodiments include P-channel transistors. Analogous to the embodiments of FIG. 4A and FIG. 4B, corresponding N-channel transistor implementations are possible with the following embodiments.

Figure 5:
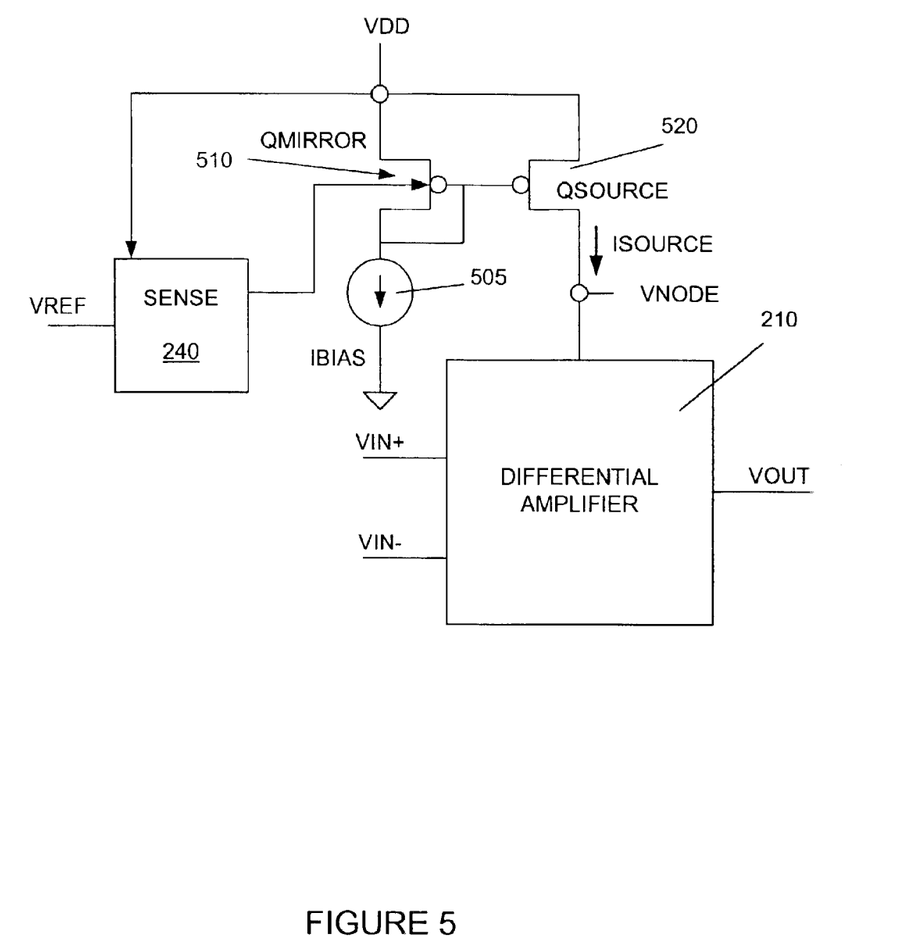
FIG. 5 shows a differential amplifier and corresponding current source according to another embodiment of the invention.

FIG. 5 shows a differential amplifier 210 and corresponding current source according to another embodiment of the invention. This embodiment includes additionally controlling current flow through mirror transistor by controlling a back bias of the mirror transistor 510.

The back bias of the mirror transistor 510 provides additional control of the current conducted by the mirror transistor 510. The current conducted by the mirror transistor 520 is initially determined by the fixed current source 505. The voltage sensor 240 provides additional control of the current conducted by the mirror transistor by controlling the back gate bias of the mirror transistor 510. As previously described, the voltage sensor 240 control is determined by variation of the power supply voltage VDD.

Current conducted by the amplifier bias current transistor 520 mirrors the current conducted by the mirror transistor 510. The current conducted by the amplifier bias current transistor 520 determines the common source node current (ISOURCE) of the differential amplifier 210, which influences the common source node (VNODE) voltage potential. As previously described, the common source node (VNODE) voltage potential influences the voltage potential VOUT.

The voltage sensor 240 control of the back gate of the mirror transistor 510 indirectly controls the common source current (ISOURCE), and therefore, the voltage potential of the common source node (VNODE), and therefore, the voltage potential of the output voltage (VOUT), based upon variations of the power supply voltage VDD.

Figure 6:
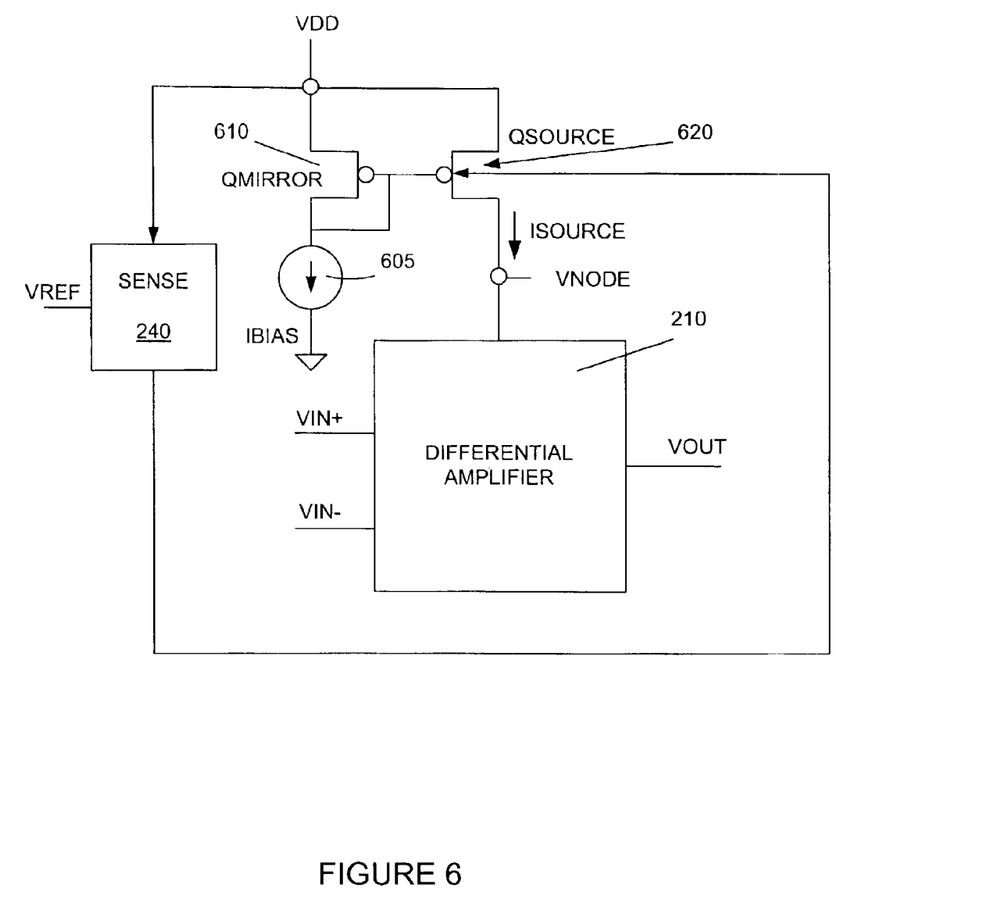
FIG. 6 shows a differential amplifier and corresponding current source according to another embodiment of the invention.

FIG. 6 shows a differential amplifier and corresponding current source according to another embodiment of the invention. This embodiment includes controlling current flow through the amplifier bias current transistor 620 by controlling a back bias of the amplifier bias current transistor 620.

The back bias of the amplifier bias current transistor 620 provides additional control of the current conducted by the amplifier bias current transistor 620. The current conducted by the amplifier bias current transistor 620 is initially determined by the current conducted by the mirror transistor 610, and therefore, by the fixed current source 605. The voltage sensor 240 provides additional control of the current conducted by the amplifier bias current transistor 620 by controlling the back gate bias of the amplifier bias current transistor 620. As previously described, the voltage sensor 240 control is determined by variation of the power supply voltage VDD.

Current conducted by the amplifier bias current transistor 620 mirrors the current conducted by the mirror transistor 610. The current conducted by the amplifier bias current transistor 620 determines the common source node current (ISOURCE) of the differential amplifier 210, which influences the common source node (VNODE) voltage potential. As previously described, the common source node (VNODE) voltage potential influences the voltage potential VOUT.

The voltage sensor 240 control of the back gate of the amplifier bias current transistor 620 directly controls the common source current (ISOURCE), and therefore, the voltage potential of the common source node (VNODE), and therefore, the voltage potential of the output voltage (VOUT), based upon variations of the power supply voltage VDD.

Back Gate Bias

Figure 7:
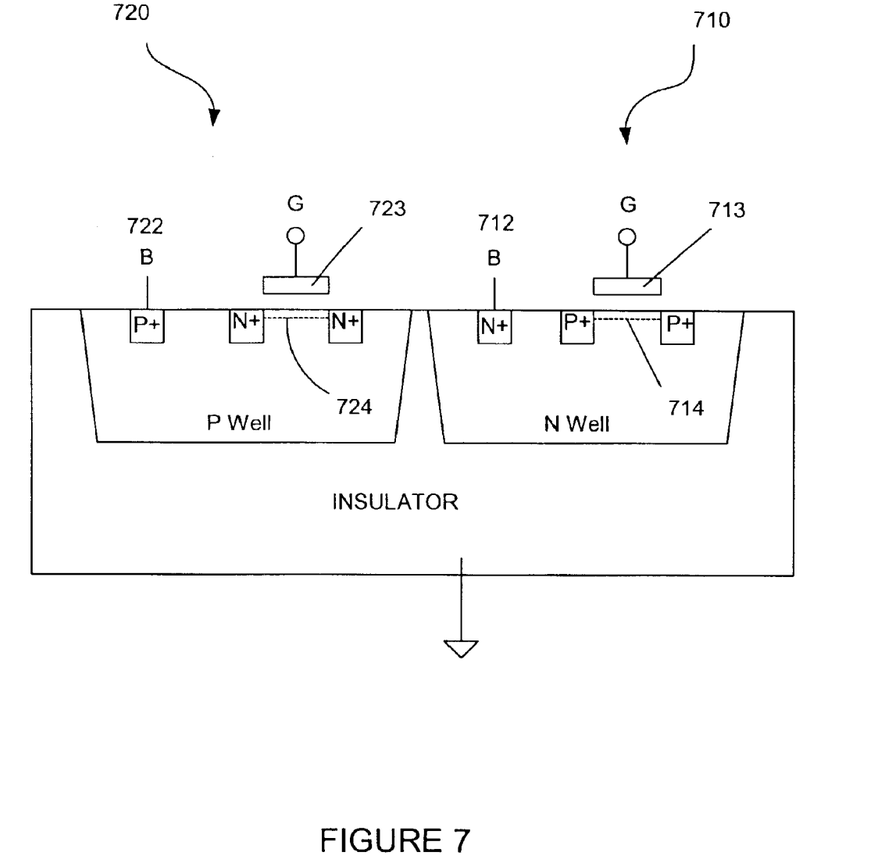
FIG. 7 shows a substrate that includes a P-channel transistor and an N-channel transistor in which the transistors include a back gate bias.

FIG. 7 shows a substrate that includes a PMOS 710 and an NMOS transistor 720, in which voltages applied to back gate control terminals 712, 722 provide a back gate bias to each of the transistors 710, 720. Voltages applied to the back gate control terminal can be biased to influence current flow through each of the transistors 710, 720.

As with most transistors, a voltage potential can be applied to the gates 713, 723 of the transistors 710, 720 to cause charge to be collected in the channels 714, 724 of the transistors 710, 720 causing the transistors to conduct current.

A voltage potential can be applied to the back gates 712, 722 (or bulk) of the transistors 710, 720 to additionally control the charge collected by the channels 714, 724 of the transistors 710, 720, which additionally controls the current conducted by the transistors 710, 720.

The embodiments of FIG. 5 and FIG. 6, utilize the back gate bias of the mirror transistor or the amplifier bias current transistor to provide additional control of the common source current (ISOURCE).

Figure 8:
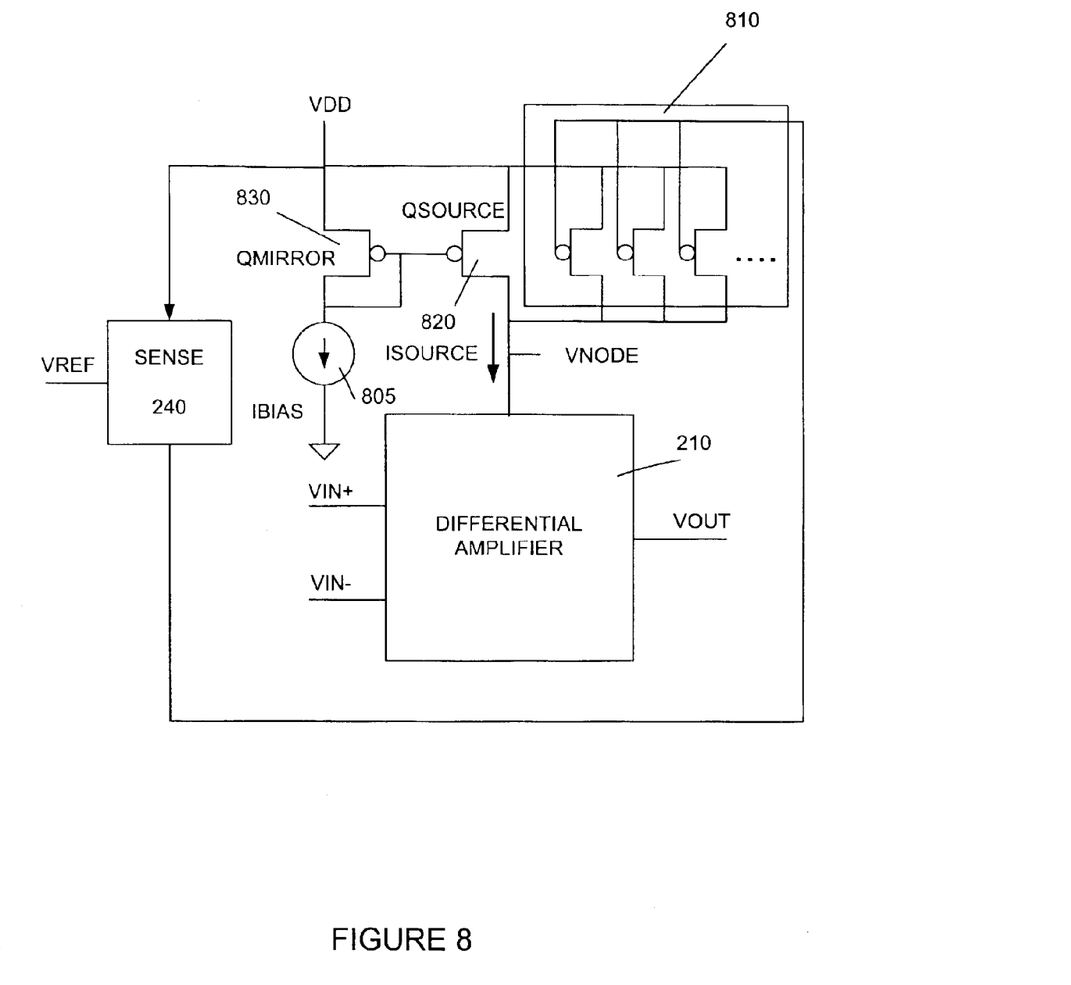
FIG. 8 shows a differential amplifier and corresponding current source according to another embodiment of the invention.

FIG. 8 shows a differential amplifier 210 and corresponding current source according to another embodiment of the invention. For this embodiment, the amplifier bias current transistor 820 is implemented in parallel with several sub-amplifier bias current transistors 810.

The output control of the voltage sensor 240 is connected to the sub-amplifier bias current transistors 810. The connection can include several control lines in which each control line is connected to a corresponding sub-amplifier bias current transistor. The control line determines which of the sub-amplifier bias current transistors 810 are conducting, and which of the sub-amplifier bias current transistors 810 are not conducting. The conducting sub-amplifier bias current transistors 810 contribute to the common source current (ISOURCE). The voltage sensor 240 controls the common source current (ISOURCE), determining which of the sub-amplifier bias current transistors 810 are turned on to conduct.

The common source current (ISOURCE) is initially determined by the current source 805 through the current mirror formed by the mirror transistor 830 and the amplifier bias current transistor 820. The common source current (ISOURCE) is additionally controlled by the voltage sensor 240 controlling which of the sub-amplifier bias current transistors 810 are conducting. The connection between the voltage sensor 240 and the sub-amplifier bias current transistors 810 can be a digital bus.

Figure 9:
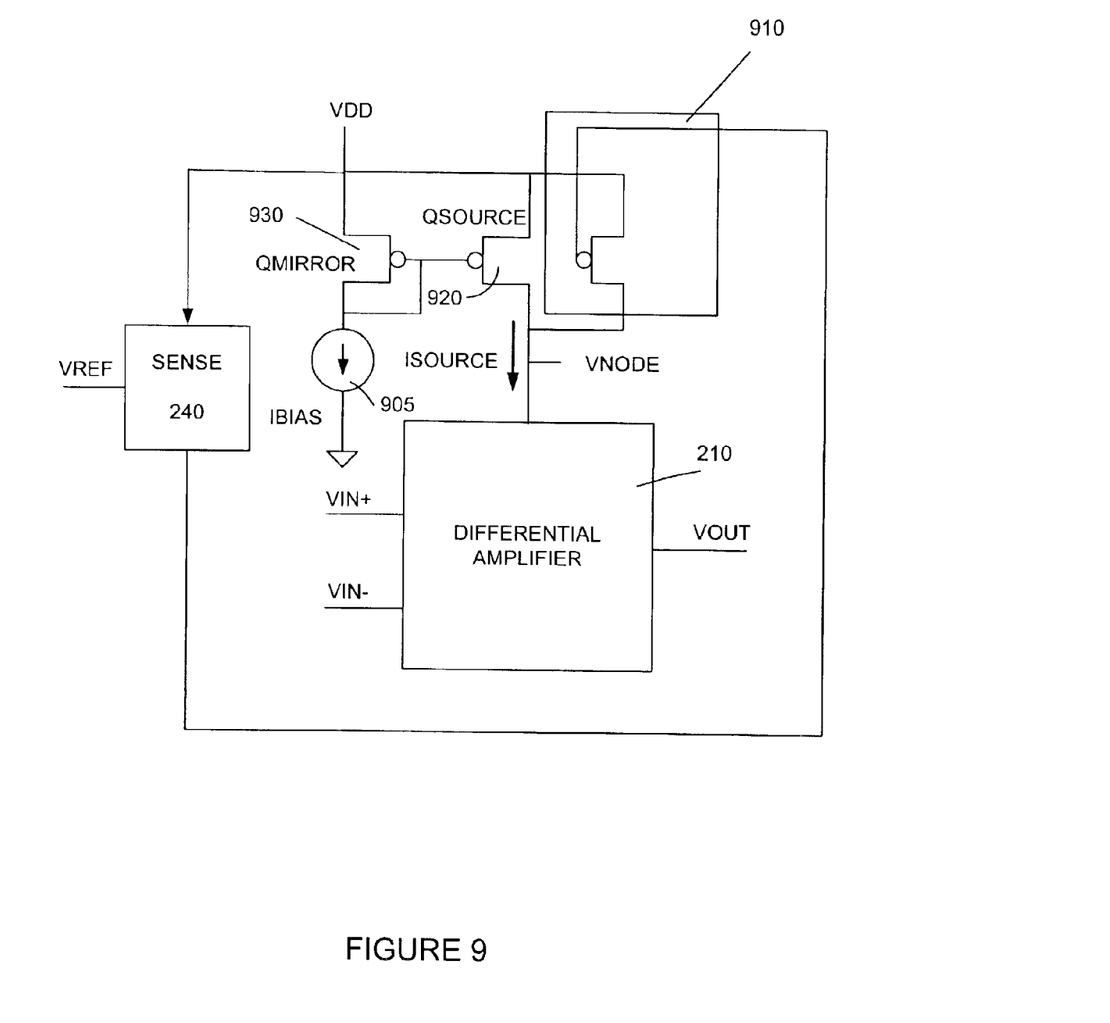
FIG. 9 shows a differential amplifier and corresponding current source according to another embodiment of the invention.

FIG. 9 shows a differential amplifier 210 and corresponding current source according to another embodiment of the invention. This embodiment is similar to the embodiment of FIG. 8. However, rather than several sub-amplifier bias current transistors 810 providing control of the common source current (ISOURCE), a single sub-amplifier bias current transistor 910 is included. The single sub-amplifier bias current transistor 910 is controlled by an analog control line from the voltage sensor 240. The voltage sensor 240 provides a voltage potential to the gate of the single sub-amplifier bias current transistor 910, and therefore, determines the amount of current conducted by the single sub-amplifier bias current transistor 910.

The common source current (ISOURCE) is initially determined by the current source 905 through the current mirror formed by the mirror transistor 930 and the amplifier bias current transistor 920. The common source current (ISOURCE) is additionally controlled by the voltage sensor 240 controlling how much current is conducted by the single sub-amplifier bias current transistor 910. The connection between the voltage sensor 240 and the sub-amplifier bias current transistors 910 can be an analog line.

Figure 10:
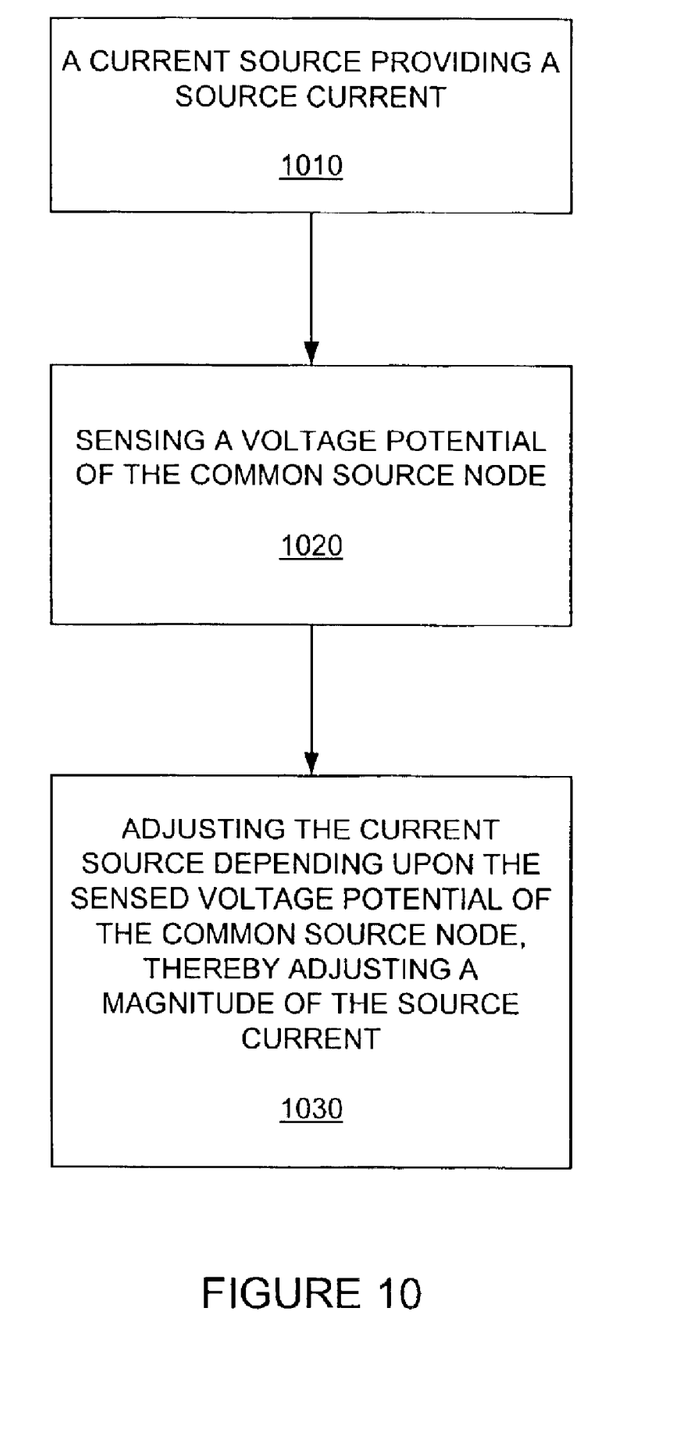
FIG. 10 shows acts according to an embodiment of the invention.

FIG. 10 shows acts according to an embodiment of the invention. The embodiment includes a method for minimizing power supply sensitivity of a differential amplifier. The differential amplifier conducts a source current at a common source node.

A first step 1010 includes a current source providing a source current.

A second step 1020 includes sensing a voltage potential of a common source node.

A third step 1030 includes adjusting the current source depending upon the sensed voltage potential of the common source node, thereby adjusting a magnitude of the source current.

Figure 11:
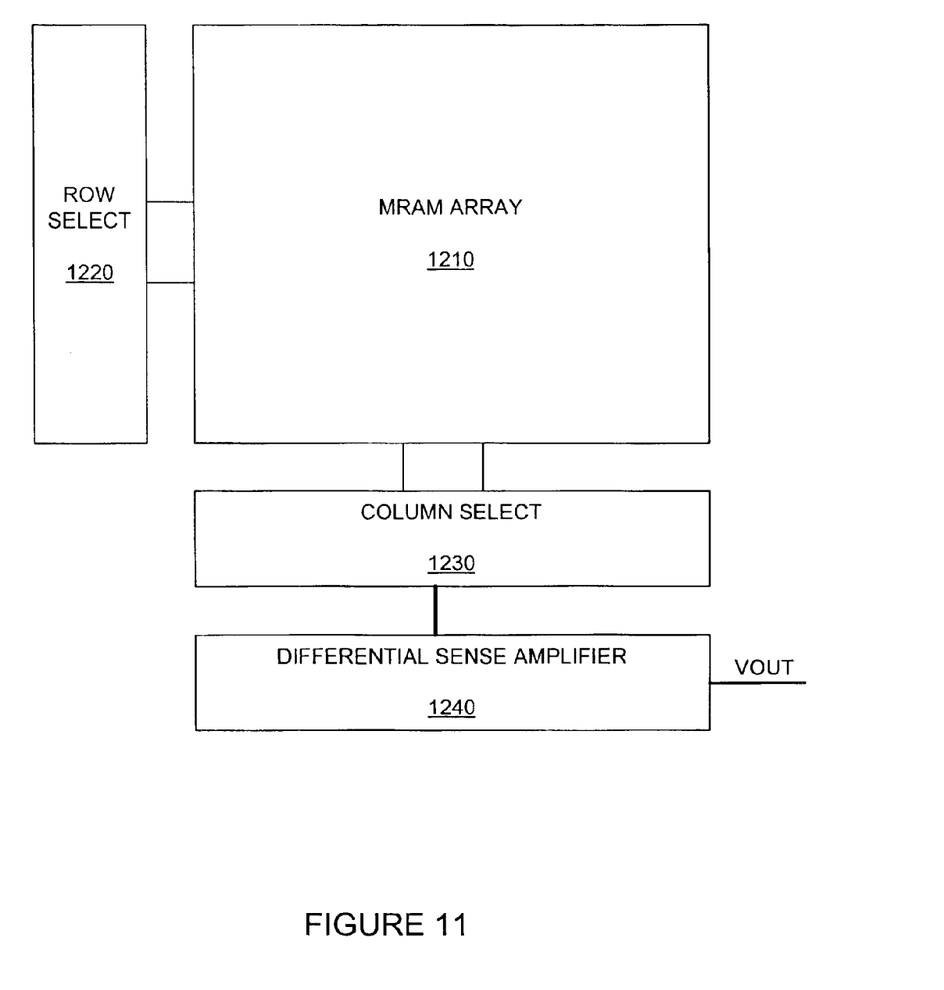
FIG. 11 shows an MRAM system according to an embodiment of the invention.

FIG. 11 shows an MRAM system according to an embodiment of the invention. The MRAM system includes an array 1210 of MRAM cells arranged in rows and columns. A particular MRAM cell is selected by a row select unit 1220 and a column select unit 1230. Row and column selection of MRAM cells is known in the art of electronics. A sense line or bit line associated with a column selection within the MRAM array 1210 can be connected to a differential sense amplifier that includes a differential amplifier, current source combination according to an embodiment of the invention.

As previously mentioned, the sense signals of MRAM typically include voltage amplitudes that are much smaller than other types of RAM (such as, DRAM and SRAM). The small amplitudes make the sensed signals more susceptible to noise, distortion and interference. Therefore, the voltage sensitivity and power supply rejection provided by embodiments of the invention are very useful in MRAM sensing applications.

Figure 12:
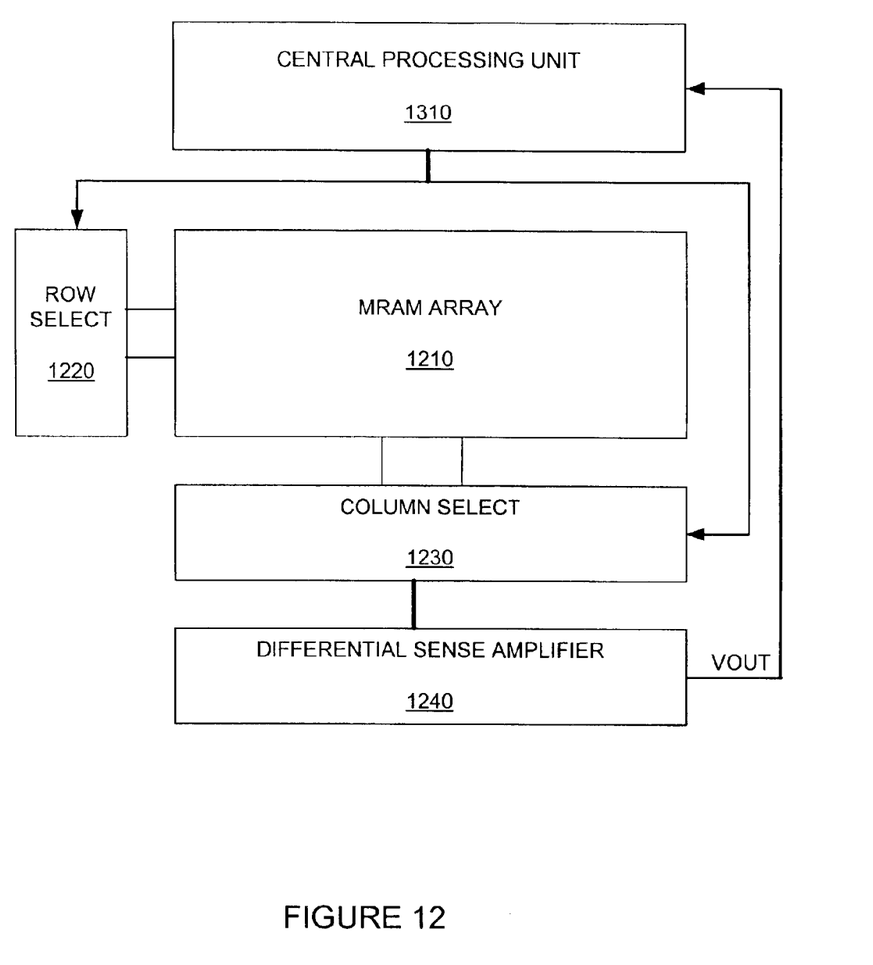
FIG. 12 shows a computer system according to an embodiment of the invention.

FIG. 12 shows a computer system according to an embodiment of the invention. This system includes a central processing unit 1310 that interfaces with an MRAM system of FIG. 11. MRAM provides features that are desirable in computer systems. For example, MRAM is non-volatile, which is useful in some computer applications.

Although specific embodiments of the invention have been described and illustrated, the invention is not to be limited to the specific forms or arrangements of parts so described and illustrated. The invention is limited only by the appended claims.

What is claimed:

1. An apparatus for minimizing power supply sensitivity of a differential amplifier, comprising:
   a current source providing a differential amplifier bias current to a common source node of the differential amplifier, the current source comprising a current mirror, the current mirror comprising an amplifier bias current transistor;
   a voltage sensor for sensing variations of a power supply associated with the current source; wherein
   variations sensed by the voltage sensor control a magnitude of the differential amplifier bias current by adjusting a back gate bias of the amplifier bias current transistor.

2. The apparatus for minimizing power supply sensitivity of claim 1, wherein the magnitude of the differential current bias current is adjusted to minimize voltage potential variations of the common source node caused by variations of the power supply.

3. The apparatus for minimizing power supply sensitivity of claim 1, wherein the provided differential amplifier bias current mirrors a current mirror bias current, and wherein the differential amplifier bias current is adjusted by adjusting the current mirror bias current.

4. The apparatus for minimizing power supply sensitivity of claim 1, wherein the voltage sensor comprises:
   a reference voltage potential;
   a comparison circuit that compares the reference voltage potential with the power supply, and generates the differential amplifier bias current control.

5. The apparatus for minimizing power supply sensitivity of claim 1, wherein the voltage sensor comprises:
   a reference voltage potential;
   a comparison circuit that compares the reference voltage potential with a voltage potential of the common source node, and generates the differential amplifier bias current control.

6. The apparatus for minimizing power supply sensitivity of claim 1, wherein transistors within the differential amplifier and the current source comprise long channels, making the transistors less sensitive in saturation mode.

7. An apparatus for minimizing power supply sensitivity of a differential amplifier, comprising:
   a current mirror providing a differential amplifier bias current to a common source node of the differential amplifier, the current mirror comprising an amplifier bias current transistor and a mirror transistor, the amplifier bias current transistor providing the differential amplifier bias current and the mirror transistor providing a mirror bias current;
   a voltage sensor for sensing variations of a power supply associated with the current source; wherein
   variations sensed by the voltage sensor control a magnitude of the differential amplifier bias current by adjusting a magnitude of the mirror bias current by adjusting a back gate bias of the amplifier bias current transistor.

8. The apparatus for minimizing power supply sensitivity of a differential amplifier of claim 7, wherein variations sensed by the voltage sensor additionally control a magnitude of the differential amplifier bias current by adjusting characteristics of the amplifier bias current transistor.

9. An apparatus for minimizing power supply sensitivity of a differential amplifier, comprising:
   a current mirror providing a differential amplifier bias current to a common source node of the differential amplifier, the current mirror comprising an amplifier bias current transistor and a mirror transistor, the amplifier bias current transistor providing the differential amplifier bias current and the mirror transistor providing a mirror bias current;
   a voltage sensor for sensing variations of a power supply associated with the current source; wherein
   variations sensed by the voltage sensor control a magnitude of the differential amplifier bias current by adjusting a back gate bias of at least one of the amplifier bias current transistor and the mirror transistor.

10. An apparatus for minimizing power supply sensitivity of a differential amplifier, comprising:
    a current source providing a differential amplifier bias current to a common source node of the differential amplifier, the current source comprising a current mirror, the current mirror comprising an amplifier bias current transistor and mirror transistor;
    a voltage sensor for sensing variations of a power supply associated with the current source; wherein variations sensed by the voltage sensor control a magnitude of the differential amplifier bias current by adjusting a back gate bias of the mirror transistor.

11. An apparatus for minimizing power supply sensitivity of a differential amplifier, comprising:

a current source providing a differential amplifier bias current to a common source node of the differential amplifier, the current source comprising a current mirror, the current mirror comprising an amplifier bias current transistor and mirror transistor, the amplifier bias current transistor comprising a plurality of sub-bias current transistors;

a voltage sensor for sensing variations of a power supply associated with the current source; wherein variations sensed by the voltage sensor control a magnitude of the differential amplifier bias current by controlling an inclusion of a number of parallel sub-bias current transistors, wherein each included sub-bias current transistors contributes to the differential amplifier bias current.

12. An apparatus for minimizing power supply sensitivity of a differential amplifier, comprising:

a current source providing a differential amplifier bias current to a common source node of the differential amplifier, the current source comprising a current mirror, the current mirror comprising an amplifier bias current transistor and mirror transistor, the amplifier bias current transistor comprises a parallel bias current transistor;

a voltage sensor for sensing variations of a power supply associated with the current source; wherein variations sensed by the voltage sensor control a magnitude of the differential amplifier bias current by adjusting a bias of the parallel bias current transistor, wherein the parallel bias current transistor contributes to the differential amplifier bias current.

* * * * *